(12) United States Patent
Kuzmenka et al.

(10) Patent No.: US 9,508,407 B2
(45) Date of Patent: *Nov. 29, 2016

(54) WIRING CONFIGURATION OF A BUS SYSTEM AND POWER WIRES IN A MEMORY CHIP

(71) Applicant: MICRON TECHNOLOGY, INC., Boise, ID (US)

(72) Inventors: Maksim Kuzmenka, Munich (DE); Dirk Scheideler, Munich (DE); Kai Schiller, Munich (DE)

(73) Assignee: Micron Technology, Inc., Boise, ID (US)

( * ) Notice: Subject to any disclaimer, the term of this patent is extended or adjusted under 35 U.S.C. 154(b) by 9 days.

This patent is subject to a terminal disclaimer.

(21) Appl. No.: 14/274,307

(22) Filed: May 9, 2014

(65) Prior Publication Data

US 2014/0247681 A1    Sep. 4, 2014

Related U.S. Application Data

(63) Continuation of application No. 13/327,057, filed on Dec. 15, 2011, now Pat. No. 8,724,360.

(51) Int. Cl.
| | |
|---|---|
| *G11C 5/06* | (2006.01) |
| *G11C 7/20* | (2006.01) |
| *G11C 7/18* | (2006.01) |
| *G11C 5/04* | (2006.01) |
| *G11C 5/02* | (2006.01) |
| *G11C 5/14* | (2006.01) |
| *H03K 19/177* | (2006.01) |
| *G11C 11/4097* | (2006.01) |

(52) U.S. Cl.
CPC .............. *G11C 7/20* (2013.01); *G11C 5/025* (2013.01); *G11C 5/04* (2013.01); *G11C 5/063* (2013.01); *G11C 5/148* (2013.01); *G11C 7/18* (2013.01); *H03K 19/1776* (2013.01); *G11C 11/4097* (2013.01)

(58) Field of Classification Search
CPC ..... G11C 5/063; G11C 7/18; G11C 11/4097; G11C 5/025; G11C 5/04
USPC .......................................... 365/63, 226, 191
See application file for complete search history.

(56) References Cited

U.S. PATENT DOCUMENTS

| | | | |
|---|---|---|---|
| 5,063,304 A | 11/1991 | Iyengar | |
| 5,500,820 A * | 3/1996 | Nakaoka | G11C 7/1078 365/189.05 |
| 6,724,594 B2 | 4/2004 | Lewicki et al. | |
| 6,970,369 B2 * | 11/2005 | Funaba | G11C 5/063 365/230.03 |
| 7,076,757 B2 * | 7/2006 | Hirata | G06F 17/505 257/E23.153 |

(Continued)

OTHER PUBLICATIONS

Kuzmenka et al., U.S. Office Action mailed Sep. 12, 2013, directed to U.S. Appl. No. 13/327,057; 10 pages.

*Primary Examiner* — Pho M Luu
(74) *Attorney, Agent, or Firm* — Dorsey & Whitney LLP

(57) ABSTRACT

Devices and circuits for wiring configurations of a bus system and power supply wires in a memory chip with improved power efficiencies. The effective resistance on the power supply wires may be reduced by utilizing non-active bus wires as additional power wires connected in parallel with the other supply wires. The non-active bus wires may reduce or prevent parasitic couplings and cross-talk effects between neighboring sensitive wires, thereby improving performance of the chip.

13 Claims, 12 Drawing Sheets

(56) References Cited

U.S. PATENT DOCUMENTS

| | | |
|---|---|---|
| 7,102,912 B2 | 9/2006 | Benzinger et al. |
| 7,315,951 B2 * | 1/2008 | Hanrieder ............... G06F 1/30 711/162 |
| 7,525,856 B2 | 4/2009 | Surico et al. |
| 7,868,656 B2 | 1/2011 | Strangfeld et al. |
| 8,724,360 B2 * | 5/2014 | Kuzmenka ............. G11C 5/063 365/189.03 |

* cited by examiner

WIRING CONFIGURATION OF A BUS SYSTEM AND POWER WIRES IN A MEMORY CHIP

REFERENCE TO RELATED APPLICATION

This application is a continuation of U.S. patent application Ser. No. 13/327,057, filed Dec. 15, 2011, U.S. Pat. No. 8,724,360, issued on May 13, 2014, the entire contents of which is incorporated herein by reference.

FIELD OF THE DISCLOSURE

The wiring configuration of a bus system and power supply wires in a memory chip is involved.

BACKGROUND

A typical wiring schematic of a memory chip, e.g., a DRAM chip, is shown in FIG. 1. In this wiring schematic, the interface logic and I/O (input/output) circuits are placed near the IC pad-row and, as a result, those circuits can have a good power connection. On the other hand, the array control logic circuits are placed somewhere between memory arrays and memory banks. FIG. 2 shows an example of a more detailed view of these array control logic circuits. Since these array logic circuits are placed in between the memory arrays, they require much longer wiring connections in order to establish connections to the corresponding IC pads. The array control logic block and interface logic block are connected via multi digit buses containing the high data-rate bidirectional data buses, which can transfer the read and write data. Further, the array control logic block and interface logic block are also connected via what is so-called as 'the configuration buses,' which can carry the low data rate, or even static signals. These static signals can comprise test-mode signals, redundancy information, or some customer specific setting information for the memory arrays, which can be configured during the chip initialization period.

The state-of-art technology for integrated circuits (IC) can impose a limit on the maximum number of metal layers which can be placed in a memory chip, e.g., a DRAM chip. The limit is often associated with the production cost and the chip area budget. First, placing any additional metal layers in a chip increases the production cost per chip, which is often undesirable in this current market for the integrated circuits. This is often undesirable in this current market for memory chips where the smaller-sized memory chips are preferred over the bigger-sized memory chips.

One way to minimize the number of metal layers to be used in a chip as well as the planar area of the chip is to configure the data bus/power wirings so that the data buses and power supply wires share the same metal layer/plan. FIG. 3 shows an example of a bus-system schematic where the data buses and power supply wires share the same metal layer/plane. The dashed arrows represent a return current, which will be explained in more detail later.

An exemplary schematic with an additional metal layer is shown in FIG. 4. The dashed arrows represent a return current. In this case, the area of the current return loop becomes much larger than in the case where the data bus wires and power supply wires share the same metal plane/layer, as shown in FIG. 3. Further, the return current can interact with different signals and cause undesirable magnetic/electric couplings. In fact, all the return currents are summed in a relatively narrow supply wire, which may cause parasitic coupling.

Accordingly, the chip schematic where the data bus wires and power supply wires share a common metal plane/layer, as shown in FIG. 3, is preferred over the chip schematic where the power supply wires are placed in an additional, separate metal plane/layer from the data bus wires, as shown in FIG. 4.

However, the chip schematic shown in FIG. 3, where the data buses and power supply wires share a common metal layer/plane may entail several problems—e.g., first is a problem of cross-talk between neighbouring data wires and mutual influence via shared power supply wires, and second is a problem of voltage drop/voltage glitch on power supply wires. Each of these problems is explained in more detail.

The cross-talk between neighbouring wires and the voltage drop on power supply wires are caused by a parasitic power balance, in other words, parasitic couplings through the power network. FIG. 5 shows an example of an interface including one driver inverter, one receiving inverter, power supply wires VDD and VSS and data wires. The parasitic, capacitive couplings are represented by the wire-to-wire capacitors shown in FIG. 5.

However, the parasitic capacitance does not form only between the neighbouring wires. In addition, the parasitic capacitance can form between part-to input (gate-to-source and gate-to-bulk) of the transistors belonging to either the driver inverter or receiver inverter. All these parasitic capacitances that form between wire-to-wire electric fields, part-to-input (gate-to-source and gate-to-bulk) electric fields can add up to further exacerbate the voltage-drop problem in the power wires in a memory chip. However, for simplicity purposes, these parasitic capacitances are not illustrated in FIG. 5.

Specifically, when the data wire changes the voltage state from VDD to VSS or VSS to VDD, the parasitic capacitors shown in FIG. 5 will be re-charged. In other words every VSS to VDD or VDD to VSS transition on the data wire causes transient current flowing via data wire from transmitter to receiver, and then returning back through the supply wires. This current flowing through the parasitic capacitors causes the voltage drop in the supply wires. Since these parasitic virtual capacitors are created partly by the parasitic input capacitive couplings between the transistors of the receiving inverter and partly by the wire-to-wire and wire-to-substrate parasitic capacitive couplings, all of these capacitive couplings can exacerbate the voltage drop problem of the power supply wires.

The voltage drop problem is explained in more detail. FIGS. 6 and 7 show exemplary voltage drop/voltage glitches on the power supply wires, as caused by the parasitic capacitors as explained above.

First, FIG. 6 shows an example of the voltage drop/voltage glitch during a rising transition period of the input signal. Wires VDD and VSS represent power supply wires. Signal IN is input signal to driving inverter DI. Wire DW is data wire, and the voltage state of data wire DW is also illustrated. VDDout is the voltage output state of supply wire VDD, whereas VSSout is the voltage output state of supply wire VSS. DWout is the voltage output state of the data wire as outputted from receiving inverter RI. During a rising transition period, input signal IN changes the voltage state from a logical 0/low state to a logical 1/high state. Then, the transistors belonging to receiving inverter RI cause the parasitic virtual capacitors Cp to form, which results in a flow of current through those parasitic virtual capacitors, as represented by the dashed arrows in FIG. 6. This current is return current CR and is the main cause of the voltage drop/voltage glitch on the power supply wires, as shown by the glitches on VDDout and VSSout.

FIG. 7 shows an example of the voltage drop/voltage glitch problem during a falling transition period of the input signal. The reference numerals are the same as shown in FIG. 6 and thus not shown in FIG. 7. During a falling transition period, the input signal to the driving inverter falls from a logical 1/high state to a logical 0/low state. Then, the data wire placed in between driving inverter DI and receiving inverter RI changes the voltage state from a logical 0/low state to a logical 1/high state, as shown by the voltage state of data wire DW in FIG. 7. Then, parasitic virtual capacitors Cp are formed as explained above, which creates a flow of current through those parasitic virtual capacitors. This return current CR flowing through parasitic capacitors Cp are represented by the dashed line in FIG. 7. Similar to the case shown in FIG. 6, return current CR affect both power supply wires VDD and VSS, specifically causing the voltage drops/voltage glitches on power supply wires VDD and VSS, as represented by VDDout and VSSout in FIG. 7. Normally not only receivers are located on the far-end of data wire. On a memory chip array control circuitry includes different kind of address decoders, sense-amplifiers and so on. Mentioned circuits in operation are having relatively big current consumption, and this current also creates a voltage drop on supply wires.

Accordingly, it is desirable to mitigate the above identified problems—the problem of cross talk between neighbouring wires and the problem of voltage drop/voltage glitches on supply wires—to improve the power efficiency of a memory chip. The cross-talk between the wires can limit the data transmitting speed, whereas the voltage drop/voltage glitches on power supply wires can adversely affect the other circuits that are connected to the same power supply wires.

The above-identified problems—the problem of cross-talk between neighbouring wires and the problem of voltage drop/voltage glitch—can be improved 1) if a wider spacing is allowed between the data buses and power supply wires, 2) if an additional shielding wire is placed in between the sensitive wires, or 3) if a wider/larger wire having a larger cross-section is used for the power supply wires. A wider spacing can reduce the risk of a cross-talk between neighbouring wires, while placing a shielding wire in between the sensitive wires can have the same effect. Specifically, the parasitic capacitive couplings between the neighbouring, sensitive wires can be removed if the wires are placed far enough from each other on the conductive metal layer.

Further, using a wider/larger wire having a larger cross-section has a lower resistance and lower inductance than a narrower wire with a smaller cross-section. Thus, using a wider wire for the power supply wires can reduce the effective resistance and inductance for the power supply wires and thereby can improve the power integrity and signal to noise ratio.

However, the above three options may not be available in practice because of the rigid production cost budget and chip area budget. All of the options—allowing a wider spacing between the wires, adding a shielding wire in between the sensitive wires and using a wider wire for the power supply wires—can burden the chip area budget and make the size of a chip bigger. As explained above, increasing the size of a chip is often undesirable in this current market for ICs.

Furthermore, adding extra wires and using wider wires instead of narrower wires can burden the production cost because both the options are expensive. Especially, wider wires are usually more expensive than narrower wires because of area considerations. Therefore, all of the three options above may well turn out to be unavailable in the actual manufacturing practice.

Accordingly, it is desirable to be able to optimize the performance of a memory chip—i.e., mitigate the problem of cross-talk and the problem of voltage drop/voltage glitches on supply wires—by re-configuring the data bus wires and power supply wires without burdening the production cost budget and the chip area budget while still improving the performance of the power deliveries in the chip.

SUMMARY

According to an embodiment, there is provided a device that can reduce the effective resistance for the power supply wires so as to improve the power efficiency of a memory chip.

Further according to an embodiment, there is provided a device that can minimize the cross-talk effects and parasitic couplings between neighboring wires so as to improve the signal to nose ratio and as consequence the performance of a memory chip.

In one embodiment the device may include a signal line extending from a first node to a second node to transfer a signal therethrough, a power line supplied with a power voltage, the power line extending along the signal line to have third and fourth nodes corresponding respectively to the first and second nodes of the signal line. The device may further include a control circuit configured to form a first electrical path between the first node of the signal line and the third node of the power line and a second electrical path between the second node of the signal line and the fourth node of the power line when the signal is free from being transferred through the signal line.

In another embodiment, the device may include a first signal line, a second signal line, and a control circuit configured to transfer a first data signal on the first signal line and short the second signal line with the power supply line during the first period when not permitting data to be transferred on the second signal line. The control circuit may be further configured to transfer a second data signal on the second signal line during a second period different from the first period.

In still another embodiment the device may include a first pad for a first power source, a second pad for a second power source, a first group of pads, a second group of pads, an interface logic connected to the first and second pads and to the first and second groups of pads, a memory array, an array control logic configured to communicate with the memory array, a first power source line provided between the interface logic and the array control logic to receive the first power source from the first pad, and a second power source line provided between the interface logic and the array control logic to receive the second power source from the second pad. The device may further include a plurality of data bus lines provided between the interface logic and the array control logic to transfer data between the first group of pads and the memory array, and a plurality of configuration bus lines provided between the interface logic and the array control logic to transfer configuration information from the second group of pads to the array control logic. The interface logic may control to transfer configuration information through the configuration bus lines in a first mode, and the interface logic may control to short a first one of the configuration bus lines with the second power line in a second mode.

DETAILED DESCRIPTION

The claimed subject matter will now be described herein with reference to illustrative embodiments. Those skilled in the art will recognize that many alternative embodiments can be accomplished using the teachings of this disclosure and that the claimed subject matter is not limited to the embodiments illustrated here for explanatory purposes.

Described are methods and circuits for wiring architectures in a memory chip that can improve the performance and/or efficiency of the power supply wires in the chip. This can be achieved, for example, by reducing the cross-talk effects between neighboring wires as well as the voltage drop/voltage glitch on power supply wires to ensure stable power deliveries in the chip. Various modifications and embodiments are possible as well, as described below and as would be readily apparent to one of ordinary skill in the art in view of the teachings of this application.

Figure 2:
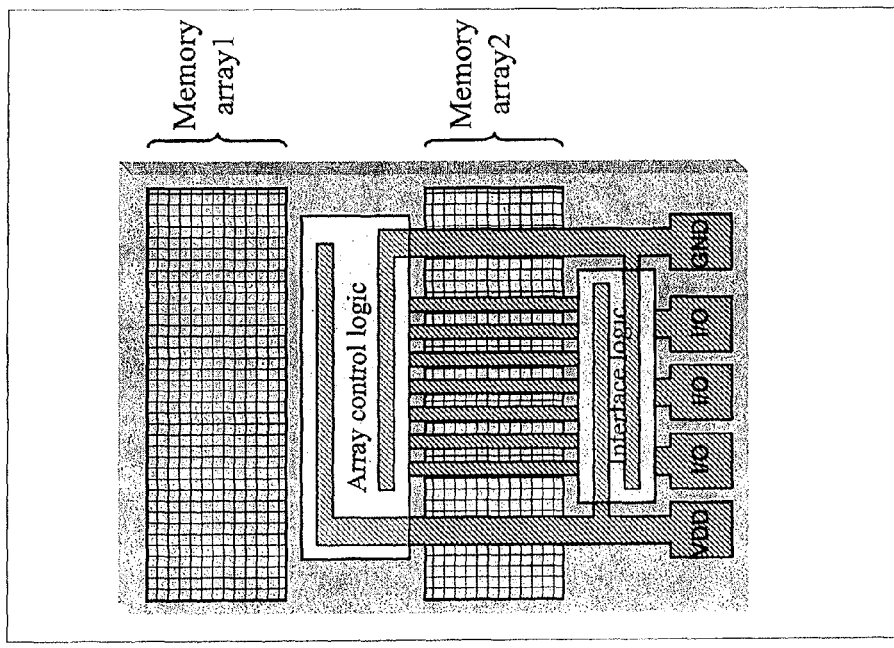
FIG. 2 illustrates an exemplary wiring topology of a memory chip, e.g., a DRAM.
Figure 1:
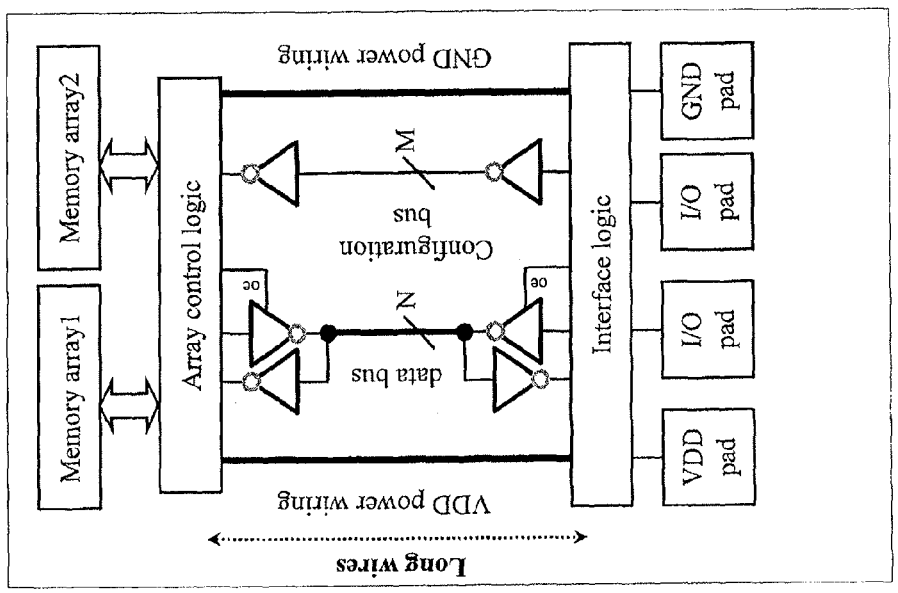
FIG. 1 illustrates an exemplary wiring schematic of a memory chip, e.g., a DRAM.
Figure 4:
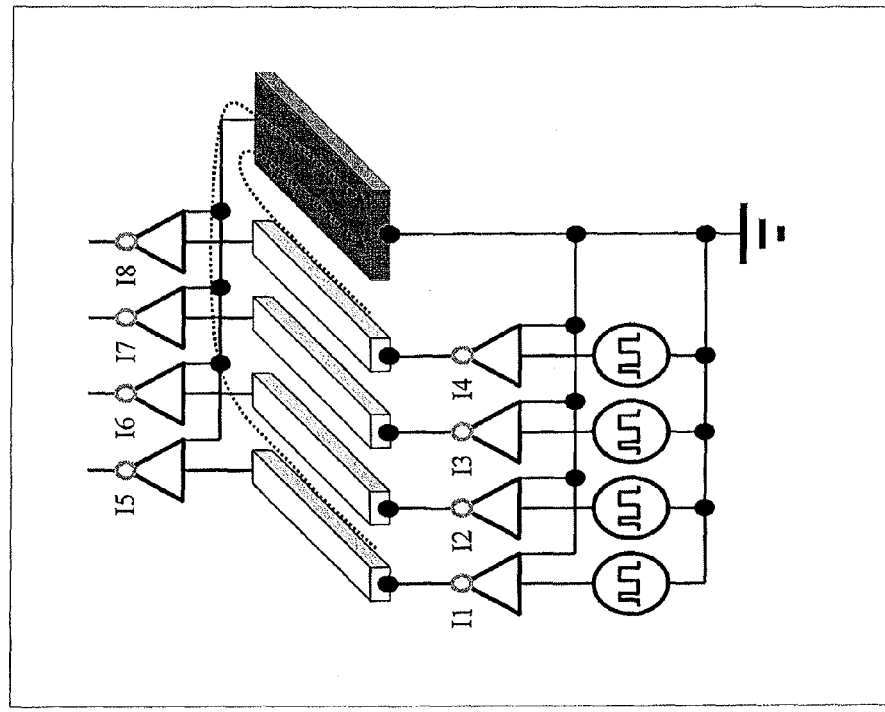
FIG. 4 illustrates an exemplary bus system schematic of a memory chip, e.g., a DRAM, and return current via supply plane where the supply plane is a separate metal layer/plane from the plane for data bus wires.
Figure 3:
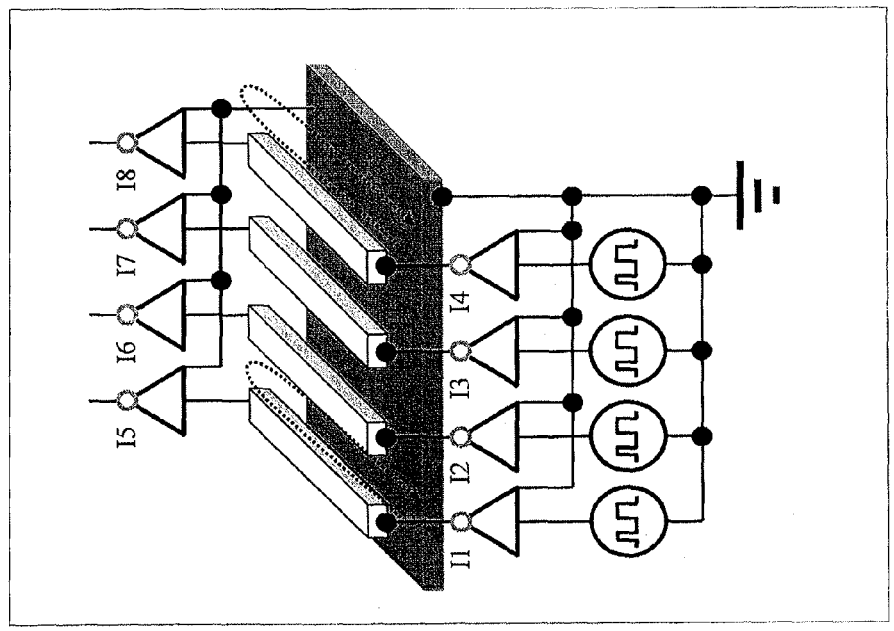
FIG. 3 illustrates an exemplary bus system schematic of a memory chip, e.g., a DRAM, and return current via supply plane.
Figure 5:
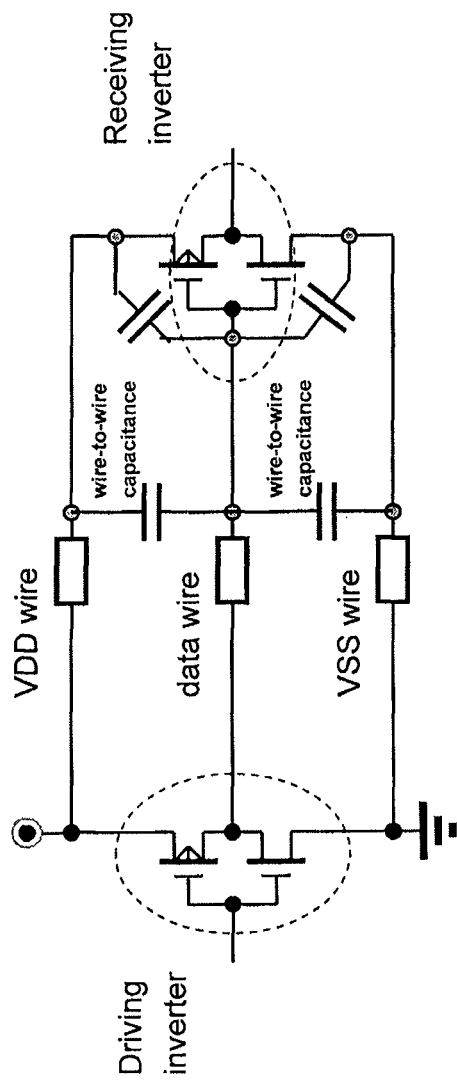
FIG. 5 illustrates an exemplary interface with one driver inverter, one receiving inverter, power wires and data wires.
Figure 6:
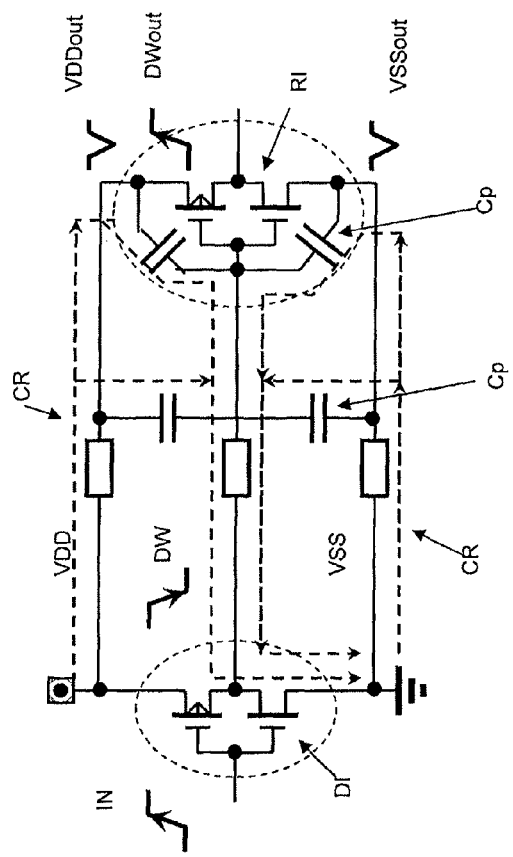
FIG. 6 illustrates an exemplary voltage-state change of the interface circuit shown in FIG. 5 during a rising transition of the input signal.
Figure 7:
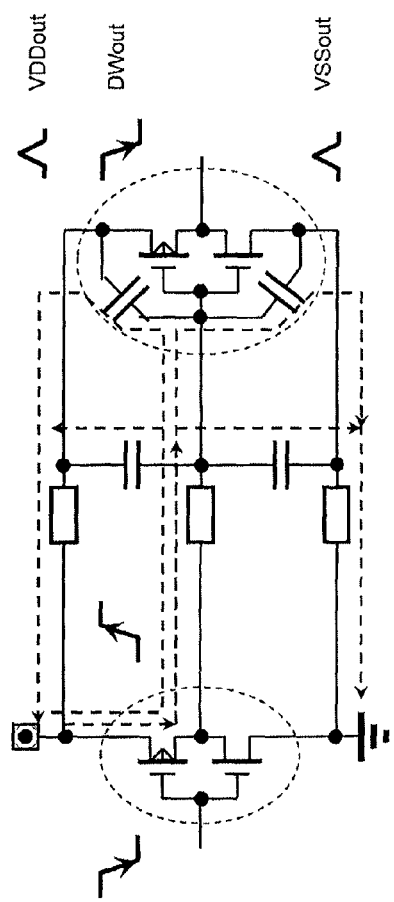
FIG. 7 illustrates an exemplary voltage-state change of the interface circuit shown in FIG. 5 during a falling transition of the input signal.

In an embodiment, the voltage drop/voltage glitch on power supply wires as well as the cross-talk effects between neighboring wires can be reduced by utilizing non-active signal wires. Specifically, the non-active signal wires can be turned into power supply wires carrying a return current. That is, the extra wires carry the return current, and therefore improve the signal integrity (AC effect). In addition the extra wires reduce the overall supply resistance to "far-located" circuits (DC effect). As shown in FIGS. 3 and 4, the transient current/return current flows through the supply wires. If the non-active signal wires can act as additional supply power wires, the transient current/return current that would have flowed through only the supply wires would also flow through not only the original supply wires but also the non-active wires. These non-active signal wires can be temporarily turned on during signal transmission period to temporarily act as virtual, additional power supply wires.

If these non-active signal wires can act as additional, virtual supply wires, the transient current/return current can have additional current paths that are connected in parallel. This can effectively reduce the total resistance and inductance, which the power supply wires will experience. If the effective, total resistance and inductance for the power supply wires can be reduced, the voltage drop/voltage glitch on the power supply wires can be reduced as well. Further, these non-active signal wires that can be temporarily turned on so as to act as additional power supply wires may be used with two-sided power connections in order to produce a shielding effect for the critical wires. This shielding effect can be further explained or defined by, for example, the following two effects:

1) Electrostatic shielding effect: Placing a 3rd wire (non-active signal wire) connected to one of supply potentials (VSS or VDD) between two wires (aggressor and victim) may reduce the effective capacitance from the aggressor-wire to the victim-wire. This method may work effectively if a shielding wire is low-resistance itself and has a low-resistive connection to GND or VDD. For example, if the connection between the 3rd wire and the shielding wire has a resistance comparable to or higher than a driver/receiver impedance (in a limit infinite resistance—shielding wire is floating), the shielding wire may bounce the following aggressor-wire, and a portion of those bounced can reach the victim-wire via an associated parasitic capacitance. Accordingly, connecting a 3rd wire to a shielding wire to supply a rail on both ends may reduce the effective shield resistance by half and therefore can improve the shielding effect.

2) Electromagnetic shielding effect: Two wires running in parallel over a long distance could be considered as one-turn windings of an air-core transformer. If current is changed in a primary (aggressor) winding, there will be a corresponding current change in a secondary (victim) winding because of magnetic couplings between the two. For example, in case of a single-layer implementation, current return loop of an aggressor often has a big overlap with current return loop of a victim. Then, an inductive coupling between the two becomes strong enough to be visible. Meanwhile, adding a shielding wire, which is grounded on both ends, is equivalent to adding another of the above described air-core transformer—that is, one more single turn but shorted winding. In this case, any current change in the aggressor loop would create a (variable) magnetic field which would cause a current change in the shielding loop. The direction of the magnetic field in the shielding loop would be opposite to that of the primary (aggressor) field, and in an ideal case, the two may compensate each other. Such transformer with one shorted winding can have close to zero efficiency—that is, there would exist very little coupling from aggressor to victim. Accordingly, this method can work effectively when the shielding trace/wire is connected on both ends. This means that the connections on those both ends would each provide a current loop.

Figure 8B:
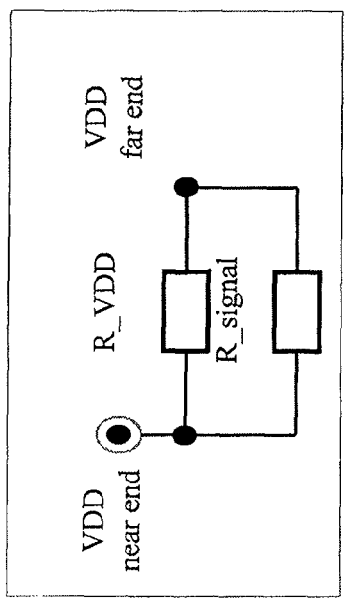
FIG. 8B illustrates an exemplary electrical connection of the circuit shown in FIG. 8A when the input signal is at a logical 0.
Figure 8C:
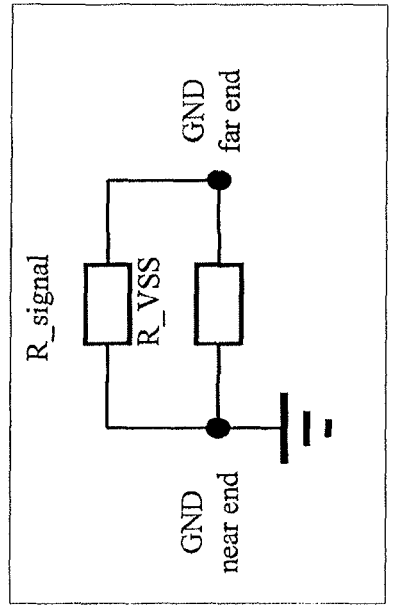
FIG. 8C illustrates an exemplary electrical connection of the circuit shown in FIG. 8A when the input signal is at a logical 1.
Figure 8A:
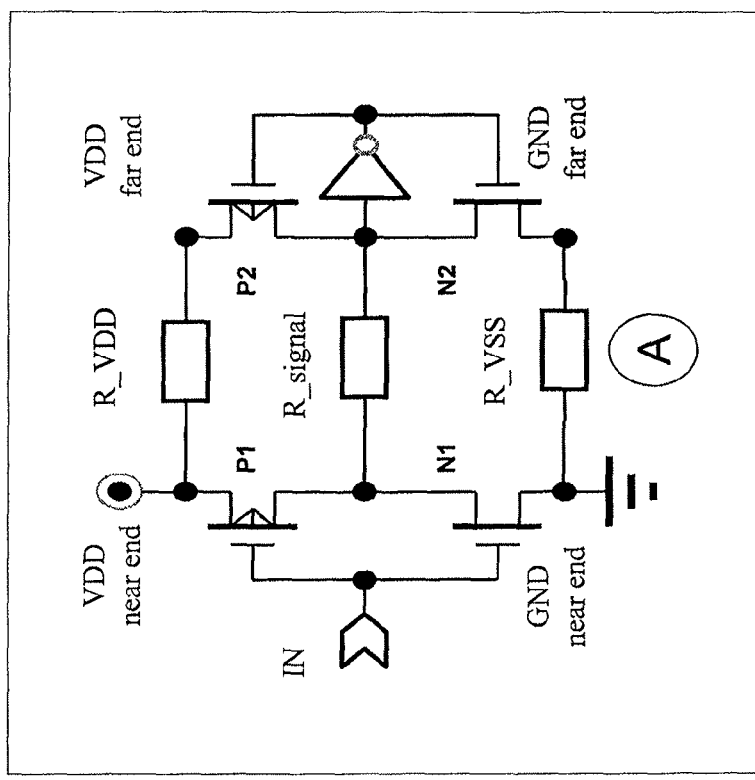
FIG. 8A illustrates an exemplary chip schematic utilizing a non-active signal wire as additional power supply wire.

An exemplary chip schematic implementing the above idea is shown in FIG. 8A. FIGS. 8B and 8C represent different connections that result in the circuit shown in FIG. 8A depending on whether the input signal to the circuit shown in FIG. 8A is at a logical 1/high state or a logical 0/low state.

FIG. 8C shows an example of the electrical connection that would result when the input signal to the circuit shown in FIG. 8A is at a logical 1/high state. A signal of logic 1/high state is input to node IN. Then, two transistors N-FETs N1 and N2 will be conducting, and resistance of signal wire R_signal will be connected in parallel to ground wiring resistance R_VSS.

FIG. 8B shows an example of the electrical connection that would result when the input signal to the circuit shown in FIG. 8A is at a logical 0/low state. A signal of logic 0/low state is input to node IN. Then, two transistors P-FETs P1 and P2 will be conducting, and thus resistance of signal wire R_signal will be connected in parallel with resistance of supply wire R_VDD through the two transistors, P-FETs P1 and P2.

In the above embodiment, it is preferred that the near-end inverter have a greater strength than the far-end latch circuit because if it is configured otherwise, the latch circuit on the far-end could keep the opposite logic states from the near-end inverter, which could result in a huge cross-current flow between the near-end inverter and the far-end latch circuit.

Although with one single circuit as shown in FIG. 8A may not be able to reduce the resistance and inductance of the power supply wires significant, the reduction may be substantial when a large number of wiring configurations employ the above circuit architecture, which is shown, for example, in FIG. 8A. In fact, many ICs nowadays have more than 50 wiring configurations, and in such environment, the cumulative effect of the above circuit architecture may be significant.

For example, a single memory array can receive around 50 unidirectional semi-static signals. If the trace width and the length for each signal are 0.25 um and 2000 um, respectively, the resistance of a single line/wiring is around 300 Ohm. If 50× of these wirings are configured so as to be virtually connected in parallel, the resistance on these wirings can be reduced to be as small as 6 Ohm (300/50).

Other Implementations

Figure 9:
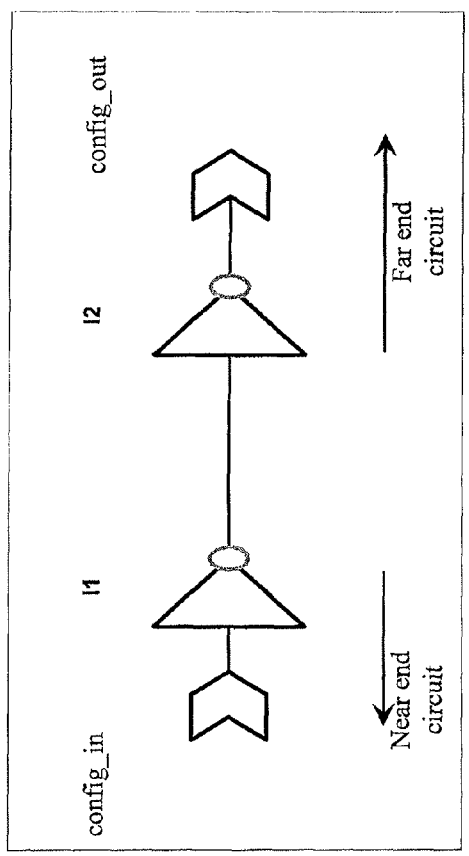
FIG. 9 shows an example of the state-of-art wiring configuration of a bus system and power supply wires in a memory chip, e.g., a DRAM.

Different examples of implementing the ideas described above and shown for example, in FIG. 8A, are explained below. First, FIG. 9 shows an example of the state-of-art wiring configuration of a bus system and power supply wires in a memory chip, e.g., a DRAM. The far-end signal is connected to gates of P-FET and N-FET of the inverter. No DC current is possible, and thus there can be no reduced resistance for the supply wires. For example, it is assumed that a physical channel is provided to transfer from one circuit to another 100 signals therebetween, and the physical channel has a given length and is limited to 210 um-width. It is further assumed to deliver to remote circuit 30 mA of power supply current with allowed density of 1 mA per 1 um trace width. Since a minimum allowed trace width and pitch are required, such requirements are assumed to be 1 um trace width and 1 um spacing. Then, the data wires occupy about 200 um of width by themselves, which would leave about only 10 um for the rest of the circuit including the power wirings. This would not be enough. Therefore, so long as the state-of-art circuit has no direct-current (DC) link, no DC current could be delivered via signal traces in the system within a given width budget. If no other metal layers are available, power budget is marginal. For this reason, some state-of-art circuits contain 2 or 3 additional metal layers, but this configuration has the problems identified above, including the current-crowding problem.

Figure 10:
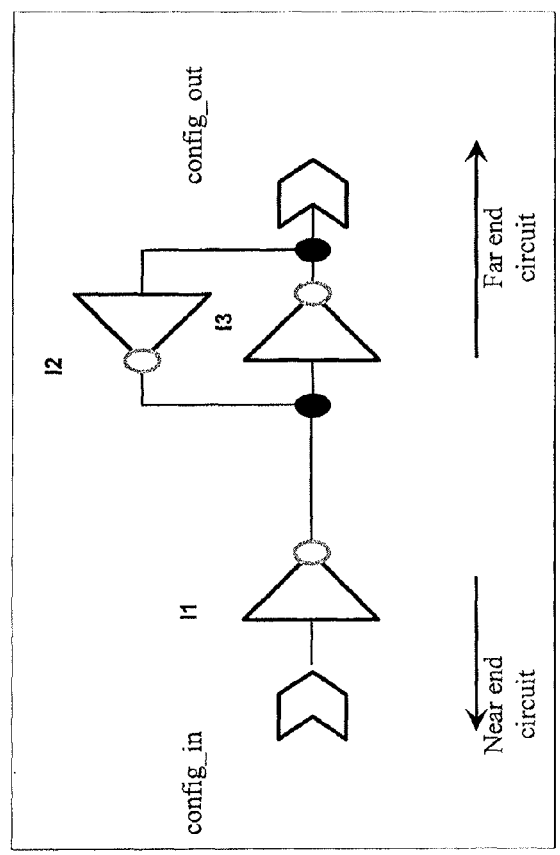
FIG. 10 shows an example of a relatively simple embodiment where a latch-like structure, comprised of I2 and I3, is added on the far-end side/receiving side of the bus system.

FIG. 10 shows an example of a relatively simple embodiment where a latch-like structure, comprised of I2 and I3, is added on the far-end side/receiving side. When a signal of logic 1 or high state is driven to node config_in, there will be a current flow through the pair of P-FETs, which will be connecting the near-end VDD with the far-end VDD. On the other hand, when a signal of logic 0 or low state is driven to node config_in, there will be a current flow through the pair of N-FETs, which will be connecting the near-end VSS with the far-end VSS.

As explained above for the exemplarily embodiment shown in FIG. 8A, it is also preferred in this embodiment shown in FIG. 10 that the near-end driver is stronger than the far-end latch-like circuit, comprised of I2 and I3, in order to guarantee proper switching of the signals. If the near-end driver is not stronger than the far-end latch inverter, there is a risk of the opposite logic states being stored and outputted due to the improper switching of the signals.

In another embodiment, the above problem can be lessened or completely removed. This can be achieved by reducing the risk of storing and outputting the erroneous, opposite logic states, which can occur due to improper signal switching when the near-end driver is not strong enough compared to the far-end latch-like circuit.

Figure 11:
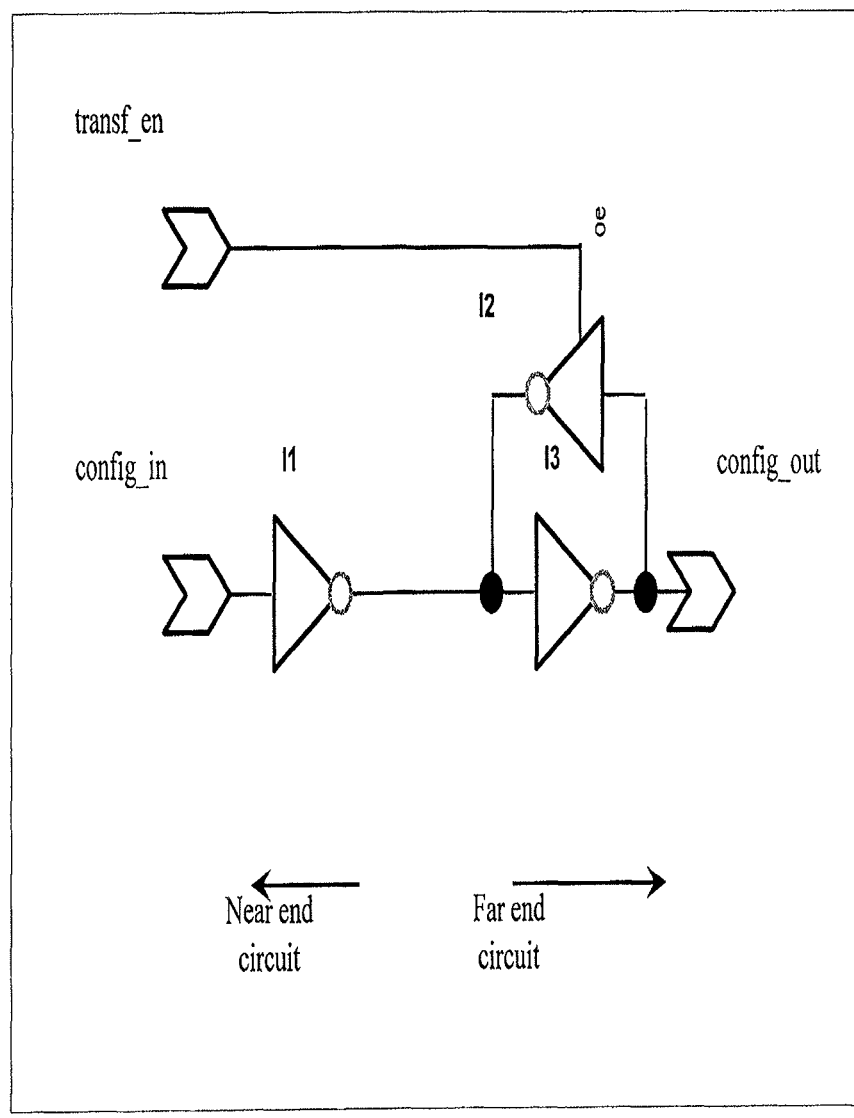
FIG. 11 shows an example of a bus-wiring configuration which can lessen or remove the requirement that the near-end driver be stronger than the far-end latch-like structure.

FIG. 11 shows an example of a bus-wiring configuration which can lessen or remove the requirement that the near-end driver be stronger than the far-end latch-like structure. This can be achieved by adding an output enable signal, oe, to the output circuit so as to control the outputting of output signals config_out, as shown in FIG. 11. This output enable signal oe is controlled by signal transf_en. Output enable signal oe is connected to the latch-like circuit, comprised of I2 and I3, on the far-end side/receiving side. Then, output signal config_out can be outputted only when output enable signal oe is active. In other times, output signal config_out cannot be outputted.

Specifically, control signal transf_en, corresponding to output enable signal oe, can be used to control the turn-on and turn-off states of the latch-like circuit on the far-end side, instead of just controlling the output signals. This way, the near-end driver and the far-end latch-like circuit will not transfer signals when control signal transf_en is not active. Instead, when control signal transf_en is not active, the transferred signal values will have been stored in the latch-like structure on the far end, preventing storing erroneous signal values due to improper switching of the signals.

For example, control signal transf_en, which corresponds to output enable signal oe, can be set at a logical 1/high state during bit update configurations so as to allow outputting of output signals config_out. At other times, control signal transf_en can be set at a logical 0/low state so as prevent the erroneous outputting of output signals config_out.

In other words, the circuit can control the timing of storing and outputting the output signals so that such timing corresponds to the timings of signal transmission periods. Consequently, the risk of outputting the wrong signals, e.g., signals of opposite logic states that have been erroneously stored due to the improper switching of the signals when the near-end driver is not strong enough compared to the far-end latch, can be reduced.

Further, in other embodiments the bus wirings can be configured so as to ensure a good connection to both supply wires VDD and VSS even when the all the bus wires carry a signal of logic 0 or a signal of logic 1. Exemplary implementations of such embodiments are shown in FIGS. 12 and 13.

When all the bus wires carry a signal of logic 0, all the bus wires are connected to supply wire VDD, as shown in FIG. 8B. On the other hand, when all the bus wires carry a signal of logic 1, all the bus wires are connected to supply wire VSS, as shown in FIG. 8C.

Therefore, when all the bus wires carry a signal of the same logic state, the wires are not likely to have a good connection to both supply wires, VDD and VSS. This means that the reduction of the effective resistance, thereby improvement of the power efficiency, is not likely to be shared by the both supply wires VDD and VSS when all the bus wires carry a signal of the same logic state. Instead, when all the bus wires carry a signal of the same logic state, only one of the power supply wires, either VDD or VSS, will experience power improvement.

Figure 12:
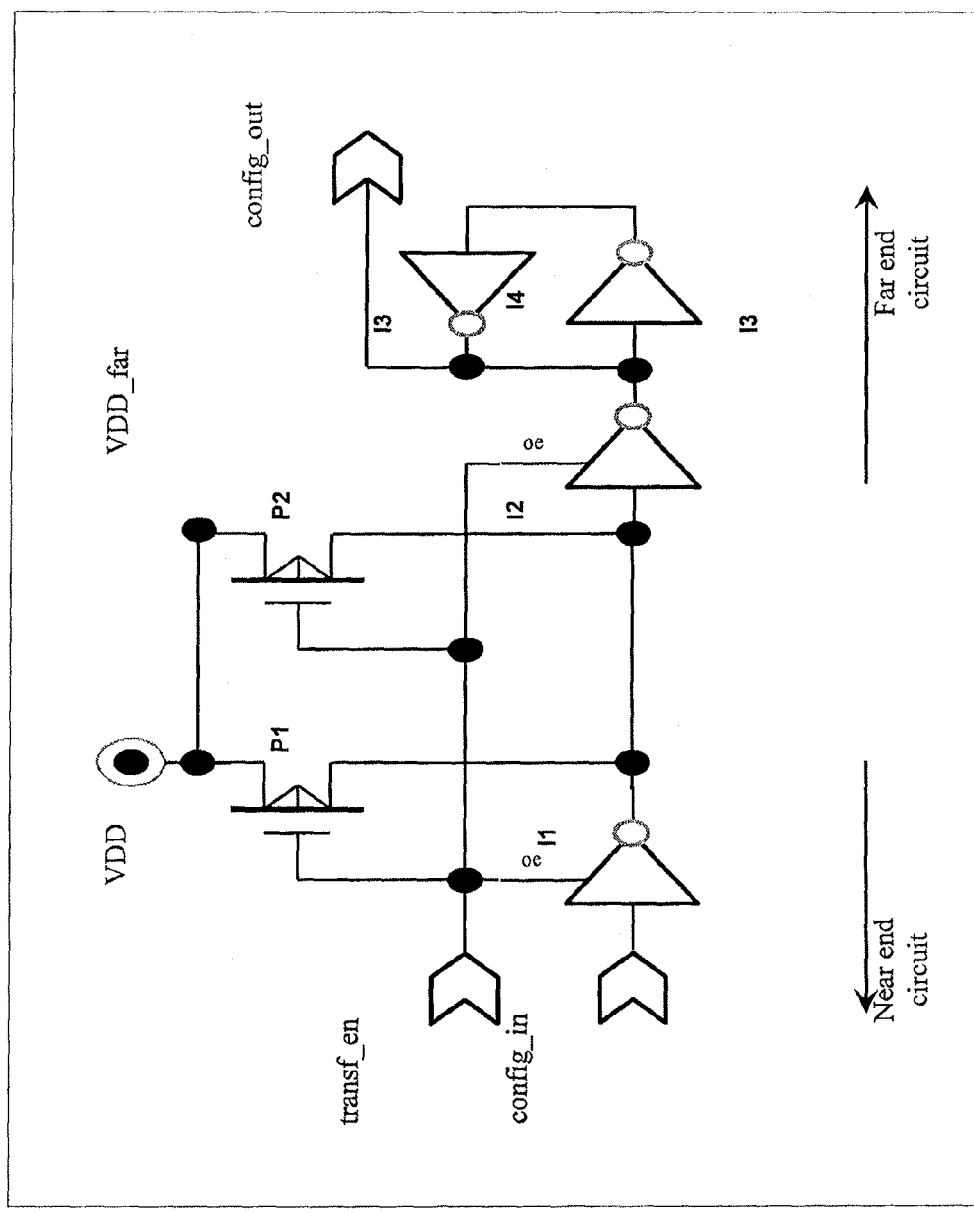
FIG. 12 shows an example of a bus-wiring configuration where the near-end and far-end of the bus line can be connected to a designated power supply wire when the bus line is not transferring data signal.
Figure 13:
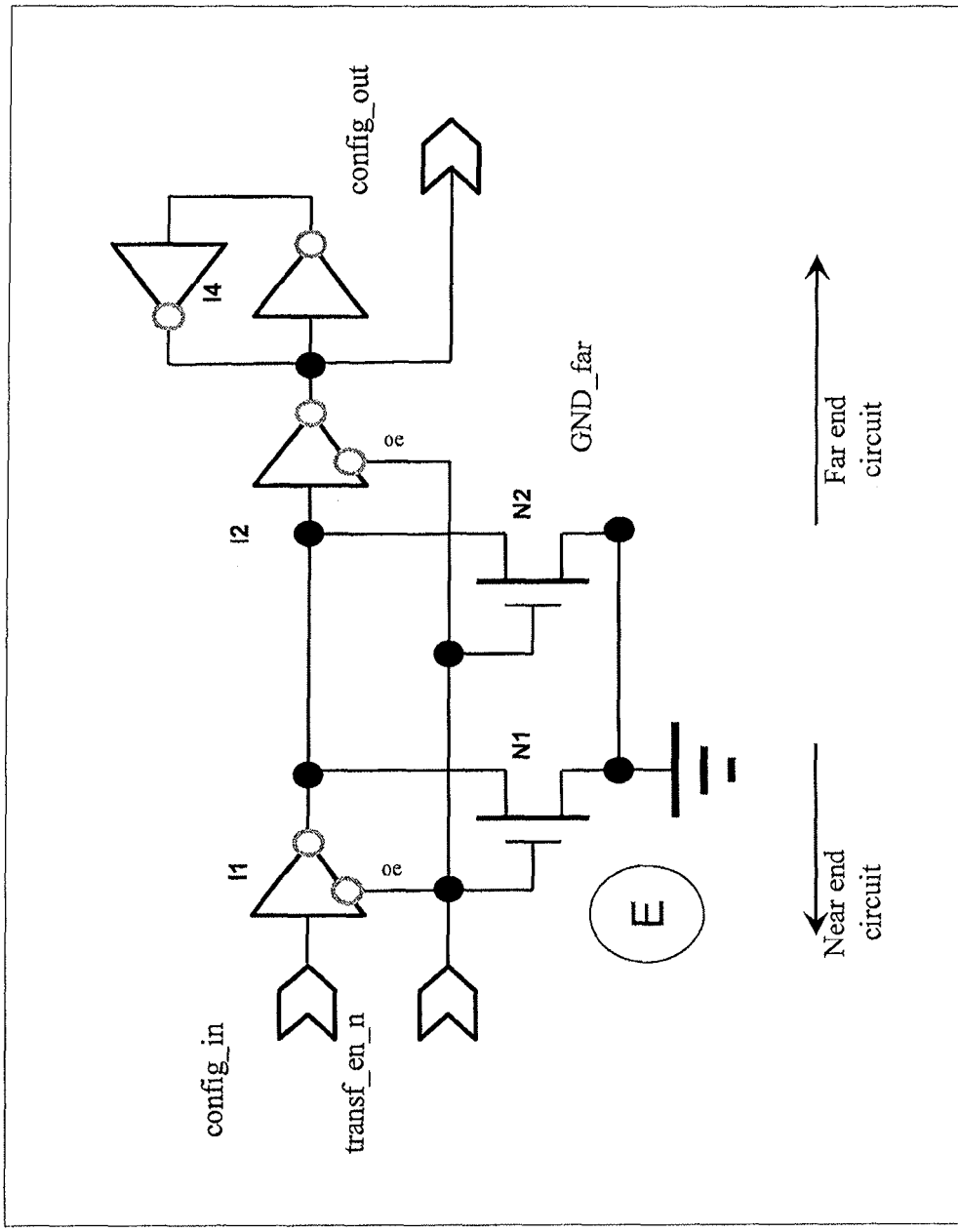
FIG. 13 shows an example of a bus-wiring configuration where the near-end and far-end of the bus line can be connected to a designated power supply wire when the bus line is not transferring data signal.

In the embodiment where the bus wirings are configured so as to ensure a good connection to both supply wires VDD and VSS even when the all the bus wires carry a signal of logic 0 or a signal of logic 1, as shown, for example, in FIGS. 12 and 13, the above problem can be mitigated or removed completely.

For example, the connection of the wires can be configured such that the near-end and the far-end of a bus line is connected to a designated power supply wire when the bus line is not transferring data signal and supposed to be operating as an additional power supply wire.

Specifically, when control signal transf_en is not active, the near-end and the far-end of a bus line is connected to supply wire via a pair of low resistive P-FETS P1 and P2 or via a pair of low resistive N-FETS N1 and N2. Thus, when multiple non-active bus lines are turned on to be used as additional power supply wires, they can each connect to their designated power supply wires, either VDD or VSS, so as to ensure that the power improvement is equally distributed between the two power supply wires, or in any other proportions as desired.

For example, if the power improvement is to be shared equally between the two power supply wires VDD and VSS in a multi-digit configuration of bus wires, the number of bus wires configured to connect to either supply wires via P-FETs or N-FETs can be set 50/50. Or, if the power improvement is to be shared in any other proportion, the number of bus wires configured to connect to either supply wires via P-FETs or N-FETs can be set in accordance with the desired proportion.

Further, this embodiment can also reduce or remove the risk of storing and outputting the erroneous signals due to improper signal switching, which may occur when the near-end driver is not strong enough compared to the far-end latch, as the embodiment shown, for example, in FIG. 11. In the embodiment shown, for example, in FIGS. 12 and 13, when control signal transf_en is active, the near-end driver will be transferring signal values to the latch-like structure on the far end. When control signal transf_en is not active, the transferred values will have been stored in the latch-like structure of I3 and I4, and the further signal transferring becomes not possible because the bus wire associated with the non-active transf_en and oe will have been connected to one of the power supply wires via transistors. Therefore, the risk of storing and outputting the erroneous signals due to improper signal switching can be reduced or removed.

<Comparison with the State-of-Art Bus System>

Figure 14:
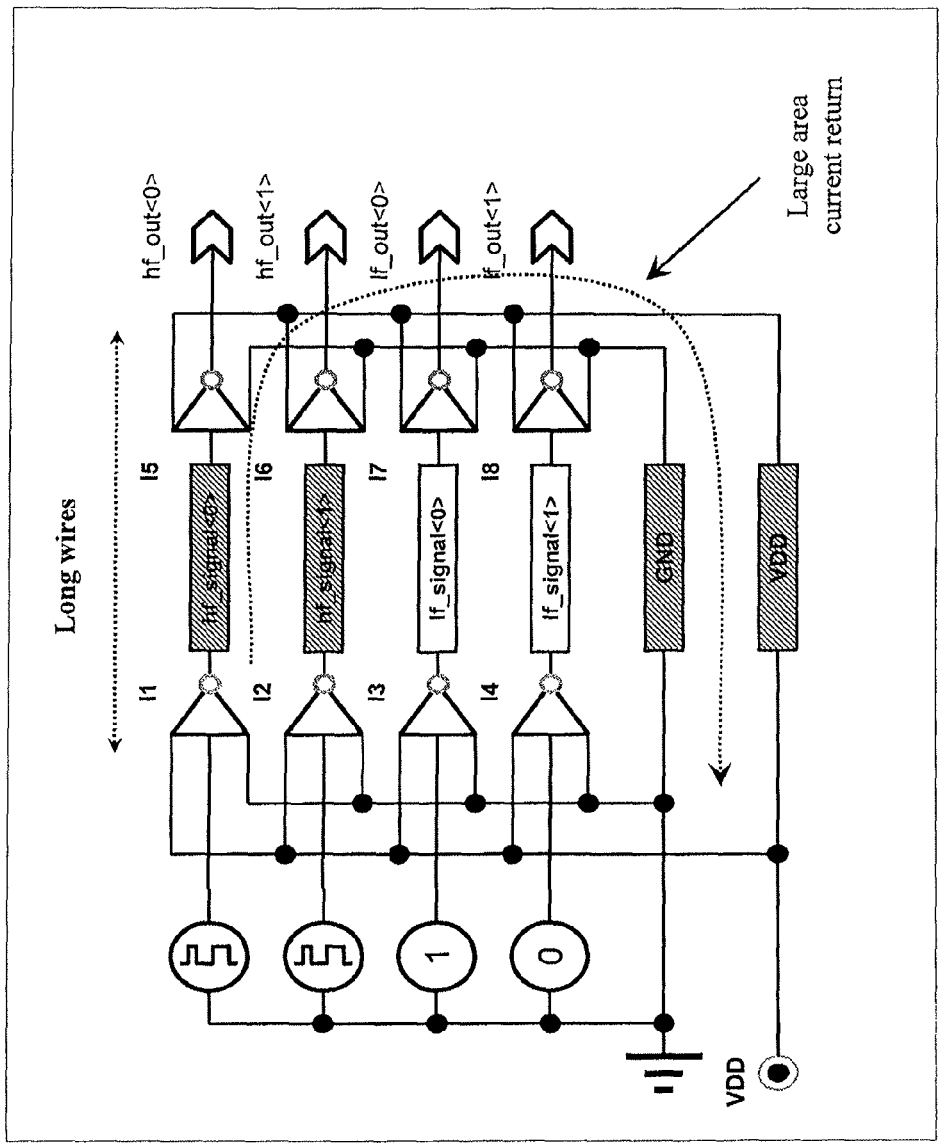
FIG. 14 shows an example of the state-of-art bus system circuit schematic for a memory chip.

FIG. 14 shows an example of the state-of-art bus system circuit schematic for a memory chip. Inverters I1, I2, I5 and I6 belong to high-data rate bus, which are represented as hf_signal<0> and hf_signal<1>. Inverters I3, I4, I7 and I8 belong to low data rate, which can be static, bus, which are represented as lf_signal<0> and lf_signal<1>. All the power supply is delivered through the path between VDD and GND, which is the same and only path for the return current as well.

Figure 15:
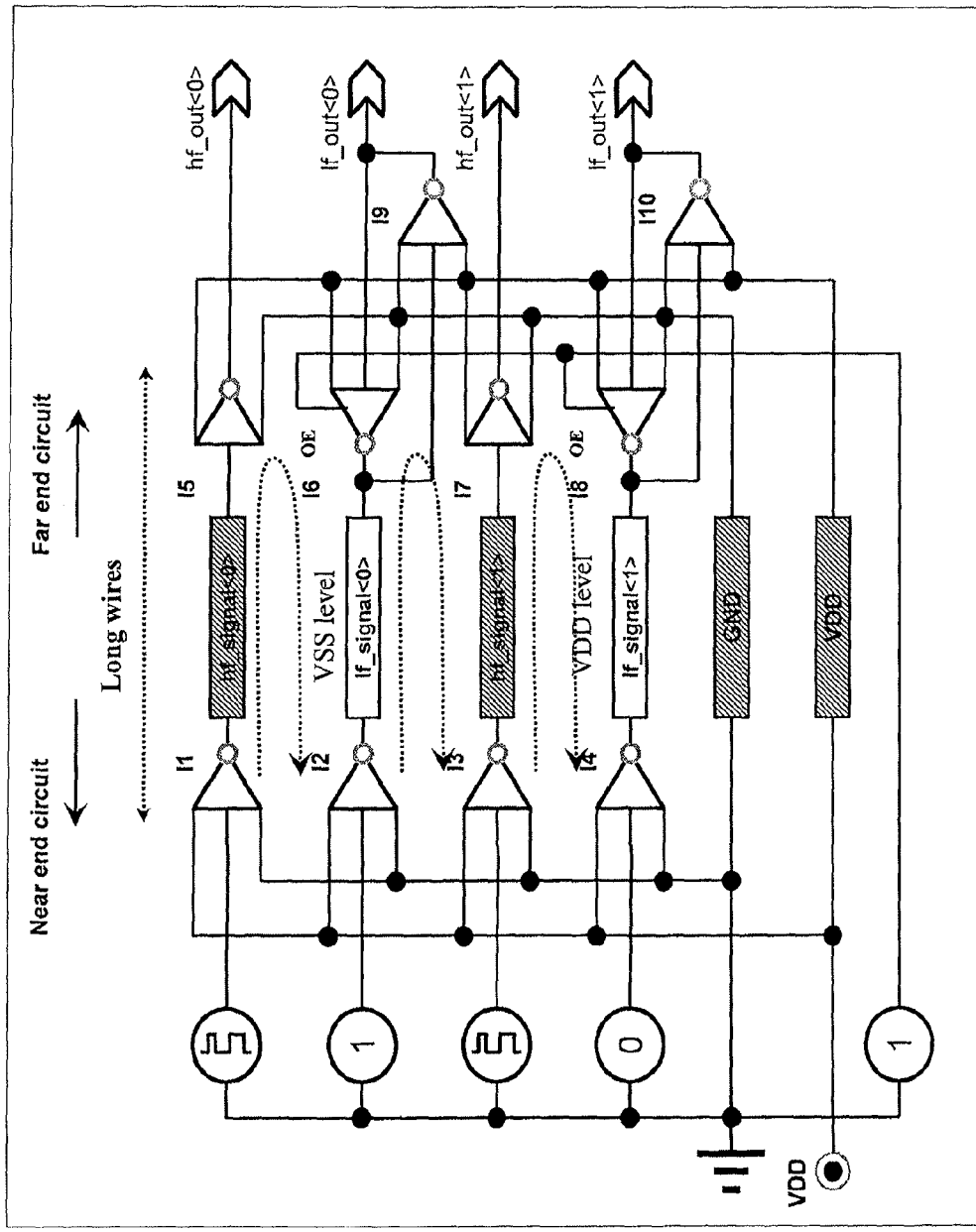
FIG. 15 shows an example of a bus system circuit schematic in a memory chip with the proposed modifications for power improvement.

On the other hand, FIG. 15 shows an example of a bus system circuit schematic in a memory chip with the proposed modifications for power improvement. This configuration is similar to the embodiment shown in FIG. 11 in which output enable signal oe is connected to the latch-like structure so as to lessen or completely remove the requirement that the near-end driver be stronger than the far-end latch-like structure. The low data rate bus, which can be static signals represented by lf_signal<0> and lf_signal<1>, are driven from the both sides, and these lines can provide additional connections to power supply wires. For example, lf_signal<0> is connected in parallel to GND wire whereas lf_signal<1> is connected in parallel to VDD wire. By placing these static signals in between the data transferring wires, the high-data rate bus, the effective resistance for the power supply wires can be reduced. Further, this configuration can also make smaller the area of the current return loop, represented by the dashed arrows in FIG. 15, as compared to the area of the current return loop in the state-of-art bus system, which is represented by the dashed arrows in FIG. 14. Furthermore, the placing of static signals in between the data transferring wires can also provide shielding effects for the neighboring data transferring wires, which can reduce the parasitic, magnetic and electrical coupling effects between the sensitive data transferring wires.

Figure 16:
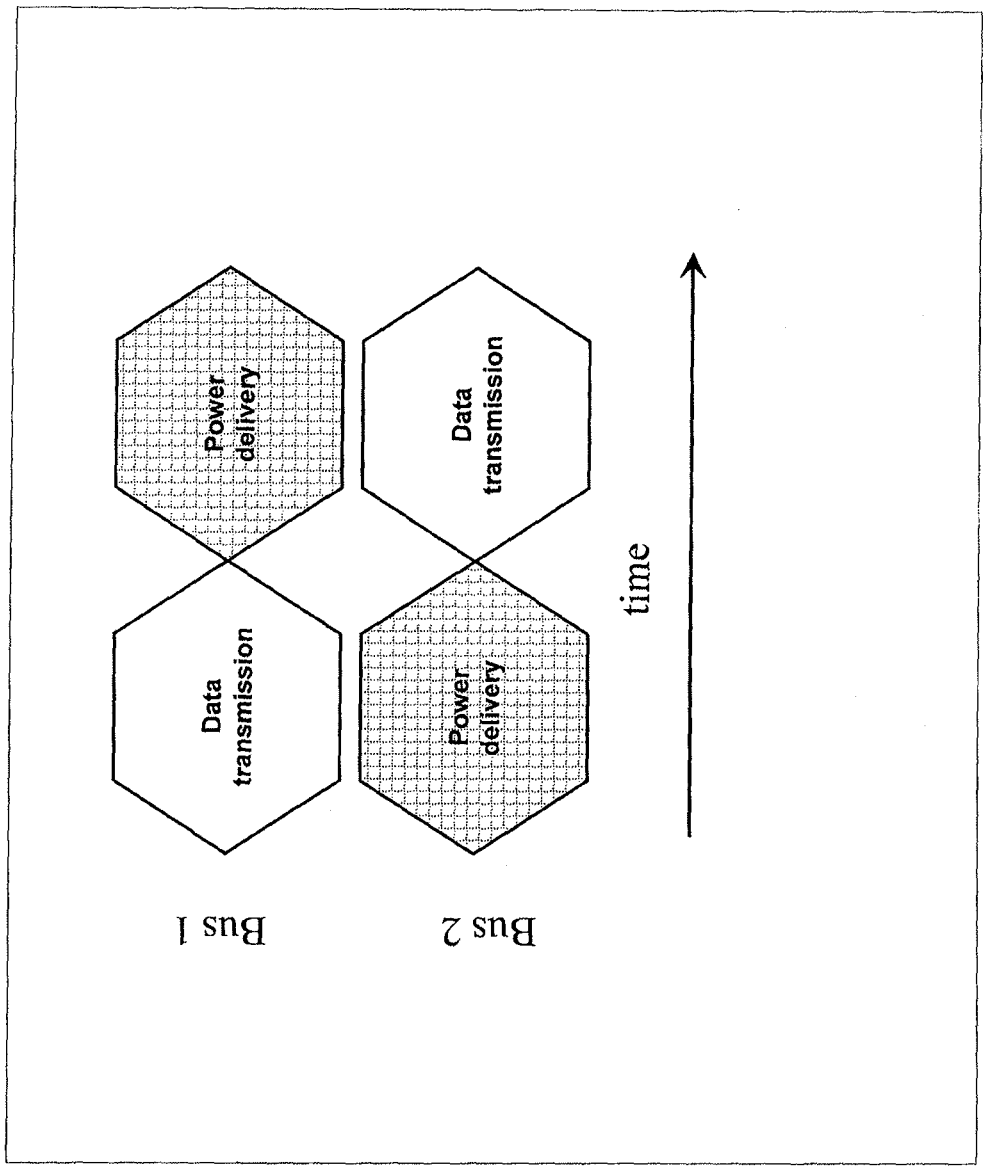
FIG. 16 illustrates an example of simple bus system architecture for a memory chip with the proposed improvements, when the bus system comprises of two buses.

FIG. 16 illustrates an example of simplified bus system architecture for a memory chip with the proposed improvements, when the bus system comprises of two buses. The proposed improvements can be achieved by utilizing the wires that belong to a non-active bus, a bus that is carrying low data rate or static signals, as extra power wires to reduce the effective resistance of the power wires, and also as extra shielding wires for shielding other wires that belong to another active bus, as well as extra current-path wires for providing current-paths for the return currents.

Furthermore, the proposed improvements can also be realized by adding switches to power supplies in order to shorten the wires that belong to a non-active bus, or by changing the control of existing bidirectional bus drivers so that the non-active bus has both ends driven by the same signal at a logical 0 or 1.

Furthermore, the proposed improvements can be implemented on the IC level or on the PCB level.

Furthermore, the proposed improvements can be modified so as to displace all the power supply wires with the signal wires so that all the power deliveries are done via the signal wires.

One skilled in the relevant art will recognize that many other possible modifications and combinations of the disclosed embodiments can be used, while still employing the same basic underlying mechanisms and methodologies. The foregoing description, for purposes of explanation, has been written with references to specific embodiments. However, the illustrative discussions above are not intended to be exhaustive or to limit the disclosure to the precise forms disclosed. Many modifications and variations can be possible in view of the above teachings. The embodiments were chosen and described to explain the principles of the disclosure and their practical applications, and to enable others skilled in the art to utilize the disclosure and various embodiments with various modifications as suited to the particular use contemplated.

Furthermore, while this specification contains many specifics, these should not be construed as limitations on the scope of what is being claimed or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A device comprising:
   a first power source line;
   a first data bus line and a second data bus line;
   a first configuration bus line arranged between the first data bus line and the second data bus line;
   a second configuration bus line arranged between the second data bus line and the first power source line; and
   a second power source line supplied with a second power source different from a first power source applied to the first power source line,
   wherein the second configuration bus line is arranged between the second data bus line and the second power source line.

2. The device as claimed in claim 1,
   wherein the first and second configuration bus lines are driven to transfer configuration information in a first mode, and
   wherein the first configuration bus line is shorted with the first power source line in a second mode different from the first mode.

3. The device as claimed in claim 2,
   wherein the second configuration bus line is shorted with the second power source line in the second mode.

4. The device as claimed in claim 2, the device further comprising:
   an interface logic configured to drive the first and second data bus lines and the first configuration bus line,
   wherein the interface logic drives the first configuration bus line to transfer the configuration information in the first mode and sets the first configuration bus line to a voltage potential of the first power source in the second mode.

5. The device as claimed in claim 4,
   wherein the interface logic further drives the second configuration bus line to transfer the configuration information in the first mode and sets the second configuration bus line to a voltage potential of the second power source in the second mode.

6. The device as claimed in claim 5,
   wherein the interface logic further drives the first and second data bus lines to transfer data information in the second mode.

7. The device as claimed in claim 6, the device further comprising:
   a memory array coupled to the first and second data bus lines.

8. The device as claimed in claim 2,
   wherein the configuration information includes a test signal.

9. The device as claimed in claim 2,
   wherein the configuration information includes a redundancy information.

10. The device as claimed in claim 2,
    wherein the configuration information includes a customer specific setting information.

11. The device as claimed in claim 2,
    wherein the second mode includes a chip initialization.

12. The device as claimed in claim 1, the device further comprising:
    a first inverter including an output coupled to a first node of the first configuration bus line;
    a second inverter including an input coupled to a second node of the first configuration bus line;
    a first transistor coupled between the first power source line and the first node of the first configuration bus line;
    a second transistor coupled between the first power source line and the second node of the first configuration bus line,
    a third inverter including an output coupled to a first node of the second configuration bus line;
    a fourth inverter including an input coupled to a second node of the second configuration bus line;
    a third transistor coupled between the second power source line and the first node of the second configuration bus line; and
    a fourth transistor coupled between the second power source line and the second node of the second configuration bus line,
    wherein an enable signal is applied to the first to fourth inverters and the first to fourth transistors.

13. A device comprising:
    a first power source line;
    a first data bus line and a second data bus line;
    a first configuration bus line arranged between the first data bus line and the second data bus line;
    a first inverter including an input coupled to a first node of the first configuration bus line;
    a second inverter including an output coupled to a second node of the first configuration bus line;
    a first transistor coupled between the first power source line and the first node of the first configuration bus line; and
    a second transistor coupled between the first power source line and the second node of the first configuration bus line,
    wherein an enable signal is applied to the first and second inverters and the first and second transistors.

* * * * *